(12) United States Patent
Kamiya et al.

(10) Patent No.: US 8,323,994 B2
(45) Date of Patent: Dec. 4, 2012

(54) GROUP III NITRIDE SEMICONDUCTOR LIGHT-EMITTING DEVICE AND METHOD FOR PRODUCING THE SAME

(75) Inventors: Masao Kamiya, Nishikasugai-gun (JP); Takashi Hatano, Nishikasugai-gun (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 97 days.

(21) Appl. No.: 12/585,630

(22) Filed: Sep. 21, 2009

(65) Prior Publication Data
US 2010/0072508 A1  Mar. 25, 2010

(30) Foreign Application Priority Data

Sep. 24, 2008  (JP) .................................. 2008-244819

(51) Int. Cl.
*H01L 21/00* (2006.01)
*H01L 33/00* (2010.01)
(52) U.S. Cl. ................. 438/22; 438/37; 438/31; 438/47; 257/94; 257/98; 257/E33.032
(58) Field of Classification Search ............... 257/94, 257/98, E33.032; 438/22, 31, 37, 47
See application file for complete search history.

(56) References Cited

U.S. PATENT DOCUMENTS

| 6,893,889 | B2 | 5/2005 | Park et al. |
| 7,244,957 | B2* | 7/2007 | Nakajo et al. ................. 257/13 |
| 7,291,865 | B2* | 11/2007 | Kojima et al. ................. 257/98 |
| 7,358,544 | B2 | 4/2008 | Sakamoto et al. |
| 7,791,098 | B2 | 9/2010 | Sakamoto et al. |
| 2002/0056847 | A1* | 5/2002 | Uemura et al. ................. 257/89 |
| 2003/0122251 | A1* | 7/2003 | Shibata et al. ................. 257/734 |
| 2005/0156188 | A1 | 7/2005 | Ro et al. |

(Continued)

FOREIGN PATENT DOCUMENTS

CN  101009353 A  8/2007

(Continued)

OTHER PUBLICATIONS

Chinese Office Action dated Apr. 6, 2011 with English-language translation.

*Primary Examiner* — Matthew Landau
*Assistant Examiner* — Khaja Ahmad
(74) *Attorney, Agent, or Firm* — McGinn IP Law Group, PLLC (57) ABSTRACT

A method for producing a Group III nitride semiconductor light-emitting device with a face-up configuration including a p-type layer and a transparent electrode composed of ITO is provided in which a p-pad electrode on the transparent electrode and an n-electrode on an n-type layer are simultaneously formed. The p-pad electrode and the n-electrode are composed of Ni/Au. The resultant structure is heat treated at 570° C. and good contact can be established in the p-pad electrode and the n-electrode. The heat treatment also provides a region in the transparent electrode immediately below the p-pad electrode, the region and the p-type layer having a higher contact resistance than that of the other region of the transparent electrode and the p-type layer. Thus, a region of an active layer below the provided region does not emit light and hence the light-emitting efficiency of the light-emitting device can be increased.

17 Claims, 6 Drawing Sheets

U.S. PATENT DOCUMENTS

| | | |
|---|---|---|
| 2006/0202217 A1 | 9/2006 | Ro et al. |
| 2007/0170596 A1* | 7/2007 | Wen et al. .................. 257/777 |
| 2008/0048172 A1* | 2/2008 | Muraki et al. ................ 257/13 |
| 2008/0123709 A1* | 5/2008 | Hersee .................. 372/45.011 |
| 2009/0305448 A1* | 12/2009 | Shakuda ...................... 438/46 |

FOREIGN PATENT DOCUMENTS

| | | |
|---|---|---|
| JP | 10-144962 A | 5/1998 |
| JP | 10-229219 A | 8/1998 |
| JP | 2000-124502 A | 4/2000 |
| JP | 2004-253545 A | 9/2004 |
| JP | 2005-011857 A | 1/2005 |
| JP | 2005-019945 A | 1/2005 |
| JP | 2005-123489 A | 5/2005 |
| JP | 2005-210050 A | 8/2005 |
| JP | 2007-158262 A | 6/2007 |
| JP | 2008-182050 A | 8/2008 |
| WO | WO 2005/096399 A1 | 10/2005 |

* cited by examiner

Fig. 5A  NO HEAT TREATMENT

GROUP III NITRIDE SEMICONDUCTOR LIGHT-EMITTING DEVICE AND METHOD FOR PRODUCING THE SAME

BACKGROUND OF THE INVENTION

1. Field of the Invention

The present invention relates to a method for producing a Group III nitride semiconductor light-emitting device, the method having a feature in the way in which a p-pad electrode and an n-electrode are formed.

2. Description of the Related Art

Conventional Group III nitride semiconductor light-emitting devices with a face-up configuration include a p-pad electrode and an n-electrode that are composed of different materials. When such light-emitting devices are produced, a p-pad electrode is formed and then an n-electrode is formed.

Alternatively, there is also a method of simultaneously forming a p-pad electrode and an n-electrode and the method is disclosed in Japanese Unexamined Patent Application Publication No. 2007-158262. In this method, a metal thin film composed of Ni/Au is simultaneously formed on a p-type layer and an n-type layer; the resultant structure is heat treated; a p-pad electrode and an n-electrode that are composed of Ti/Au are simultaneously formed on the metal thin film; and the resultant structure is again heat treated. With this method, Ni is diffused into the n-type layer and hence the contact resistance between the n-type layer and the n-electrode can be decreased. Additionally, the p-pad electrode and the n-electrode are simultaneously formed and hence the production steps can be simplified.

A Group III nitride semiconductor light-emitting device with a face-up configuration is desirably produced such that, since a p-pad electrode does not allow light to pass therethrough, a region of an active layer right below the p-pad electrode does not emit light, thereby increasing the light-emitting efficiency of the light-emitting device. Techniques for forming such a region are disclosed, for example, in Japanese Unexamined Patent Application Publication Nos. 10-229219, 10-144962, and 2000-124502.

In the technique disclosed in Japanese Unexamined Patent Application Publication No. 10-229219, a transparent electrode composed of a metal thin film is formed on a p-type layer; a p-pad electrode containing a metal that reacts with nitrogen is formed on the transparent electrode; the resultant structure is heat treated so that the metal contained in the p-pad electrode reacts with nitrogen in the p-type layer, thereby generating nitrogen vacancy in the p-type layer to form a high-resistance region. The presence of this high-resistance region in the p-type layer makes a region of an active layer right below the p-pad electrode emit no light.

Alternatively, the region of the active layer right below the p-pad electrode is made to emit no light by forming an n-type layer between the p-pad electrode and the p-type layer in accordance with the technique disclosed in Japanese Unexamined Patent Application Publication No. 10-144962, or by forming an insulation film such as $SiO_2$ between the p-pad electrode and the p-type layer in accordance with the technique disclosed in Japanese Unexamined Patent Application Publication No. 2000-124502.

SUMMARY OF THE INVENTION

However, when a p-pad electrode is formed and then an n-electrode is formed, there is a case where a resist used in patterning the p-pad electrode is not sufficiently stripped off and partially remains on an n-type layer exposed by etching. In this case, problems are caused such as separation of the n-electrode from the n-type layer.

In the method of simultaneously forming a p-pad electrode and an n-electrode disclosed in Japanese Unexamined Patent Application Publication No. 2007-158262, a transparent electrode is formed of the metal thin film and this metal thin film serves to reduce the contact resistance between the n-electrode and an n-type layer. For this reason, when a transparent electrode is formed of an oxide such as ITO (indium oxide doped with Sn (tin)) instead of the metal thin film, the method disclosed in Japanese Unexamined Patent Application Publication No. 2007-158262 cannot be used. The method disclosed in Japanese Unexamined Patent Application Publication No. 2007-158262 may be used after a transparent electrode formed of an oxide such as ITO is deposited on a p-type layer. However, such a transparent electrode composed of an oxide such as ITO is used because it has a higher light transmittance than metal thin films and hence light can be efficiently emitted through the transparent electrode. For this reason, when a metal thin film is formed on a transparent electrode composed of an oxide such as ITO, the advantage of using ITO is not provided.

When a region of an active layer below a p-pad electrode is made to emit no light by the techniques disclosed in Japanese Unexamined Patent Application Publication Nos. 10-229219, 10-144962, and 2000-124502, the production steps become complicated, thereby increasing the production cost. In particular, when an insulation film is used as disclosed in Japanese Unexamined Patent Application Publication No. 2000-124502, there is a case where the insulation film cracks and hence devices produced with this technique have low reliability.

Accordingly, an object of the present invention is to provide a method for producing a Group III nitride semiconductor light-emitting device in which a p-pad electrode and an n-electrode can be simultaneously formed even when a transparent electrode composed of an oxide such as ITO is formed on a p-type layer. Another object of the present invention is to provide a Group III nitride semiconductor light-emitting device in which a region of an active layer below a p-pad electrode emits no light, and a method for producing such a light-emitting device.

A first aspect of the present invention is a method for producing a Group III nitride semiconductor light-emitting device with a face-up configuration, the light-emitting device including a p-type layer, a transparent electrode comprising an oxide and formed on the p-type layer, a p-pad electrode comprising Ni/Au and formed on the transparent electrode and on a surface side of the light-emitting device, and an n-electrode comprising Ni/Au and formed on the surface side of the light-emitting device; the method including the step of simultaneously forming the p-pad electrode and the n-electrode.

The term "Group III nitride semiconductor" refers to, for example, GaN, AlGaN, InGaN, or AlGaIN. A Group III nitride semiconductor is represented by a general formula $Al_xGa_yIn_{1-x-y}N$ ($0 \leq x \leq 1$, $0 \leq y \leq 1$, $0 \leq x+y \leq 1$). An example of an n-type impurity is Si. An example of a p-type impurity is Mg.

A second aspect of the present invention is the method according to the first aspect, further including the step of, after the step of forming the p-pad electrode and the n-electrode, forming a high resistance region in the transparent electrode immediately below the p-pad electrode by a heat treatment at 500° C. to 650° C., which high resistance region has a contact resistance to the p-type layer higher than a contact resistance to the p-type layer of a region other than the high resistance region in the transparent electrode.

When the heat treatment temperature is less than 500° C., the region in the transparent electrode immediately below the p-pad electrode does not have a high contact resistance, which is not preferable. When the heat treatment temperature is more than 650° C., the p-pad electrode and the n-electrode can be separated, which is not preferable. More preferably, the heat treatment is conducted in a temperature range of 550° C. to 600° C.

A third aspect of the present invention is the method according to the first or second aspect, wherein the transparent electrode comprises an indium oxide-based material.

A fourth aspect of the present invention is the method according to the third aspect, wherein the transparent electrode comprises any one selected from a group consisting of ITO and ICO. ITO is indium oxide ($In_2O_3$) doped with Sn (tin). ICO is indium oxide ($In_2O_3$) doped with Ce (cerium).

A fifth aspect of the present invention is a Group III nitride semiconductor light-emitting device having a face-up configuration, the light-emitting device including: a p-type layer, a transparent electrode comprising an oxide and formed on the p-type layer, a p-pad electrode comprising a material containing Ni or Ti and formed on the transparent electrode and on a surface side of the light-emitting device, and an n-electrode on the surface side of the light-emitting device, wherein the transparent electrode includes a high resistance region immediately below the p-pad electrode, which high resistance region has a contact resistance to the p-type layer higher than a contact resistance to the p-type layer of a region other than the high resistance region in the transparent electrode.

A sixth aspect of the present invention is the Group III nitride semiconductor light-emitting device according to the fifth aspect, wherein the p-pad electrode comprises Ni/Au.

A seventh aspect of the present invention is the Group III nitride semiconductor light-emitting device according to the sixth aspect, wherein the n-electrode comprises Ni/Au.

An eighth aspect of the present invention is the Group III nitride semiconductor light-emitting device according to any one of the fifth to seventh aspects, wherein the transparent electrode comprises an indium oxide-based material.

A ninth aspect of the present invention is the Group III nitride semiconductor light-emitting device according to the eighth aspect, wherein the transparent electrode comprises ITO or ICO.

A tenth aspect of the present invention is the Group III nitride semiconductor light-emitting device according to any one of the fifth to ninth aspects, wherein either or both of the p-pad electrode and the n-electrode include wiring serving as an extension electrode.

According to the first aspect in which a p-pad electrode and an n-electrode are composed of Ni/Au, even when a transparent electrode composed of an oxide is formed on a p-type layer, the contact between the p-pad electrode and the transparent electrode can be established before a heat treatment and the contact between the n-electrode and an n-type layer can be established after the heat treatment. Thus, the p-pad electrode and the n-electrode can be simultaneously formed and hence the production steps of the light-emitting device can be simplified.

According to the second aspect in which a p-pad electrode comprises Ni/Au and a heat treatment is conducted at 500° C. to 650° C., a high resistance region in a transparent electrode immediately below the p-pad electrode is formed such that the region have a contact resistance to a p-type layer higher than the contact resistance of the other region of the transparent electrode. As a result, a region in an active layer right below the formed high resistance region having a higher contact resistance in the transparent electrode is made to emit no light, thereby increasing the light-emitting efficiency of the light-emitting device because a current density becomes larger and the current is effectively used for an emission. The contact between the n-electrode and an n-type layer can be established by the heat treatment.

According to the third aspect, a transparent electrode may comprise an indium oxide-based material. In particular, according to the fourth aspect, a transparent electrode may comprise ITO or ICO.

According to the fifth aspect, when a p-pad electrode comprises a material containing Ni or Ti, a high resistance region in a transparent electrode immediately below the p-pad electrode is formed such that the region have a contact resistance to a p-type layer higher than the contact resistance of the other region of the transparent electrode. As a result, a region in the active layer below the formed high resistance region having a higher contact resistance can be made to emit no light, thereby increasing the light-emitting efficiency of a light-emitting device. In particular, according to the sixth aspect, a p-pad electrode may comprise Ni/Au. According to the seventh aspect, when an n-electrode comprises Ni/Au, which a p-pad electrode also comprises, the p-pad electrode and the n-electrode can be simultaneously formed.

According to the eighth aspect, a transparent electrode may comprise an indium oxide-based material. In particular, according to the ninth aspect, a transparent electrode may comprise ITO or ICO.

According to the tenth aspect in which wiring serving as an extension electrode is provided, current can be diffused to a higher degree in a planar direction.

DESCRIPTION OF THE PREFERRED EMBODIMENTS

Hereinafter, embodiments of the present invention are described with reference to the drawings. However, the present invention is not restricted to these embodiments.

First Embodiment

Figure 1:
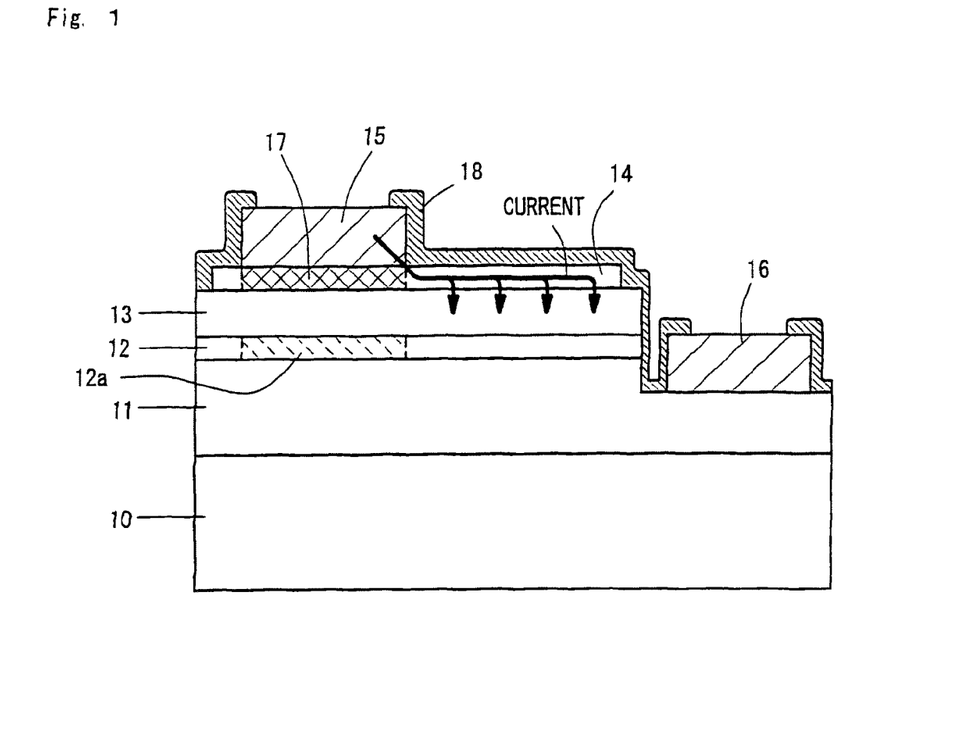
FIG. 1 is a section view showing the configuration of a Group III nitride semiconductor light-emitting device according to a first embodiment.

FIG. 1 is a section view showing the configuration of a Group III nitride semiconductor light-emitting device with a face-up configuration according to a first embodiment. This Group III nitride semiconductor light-emitting device includes, in ascending order, a growth substrate 10 composed of sapphire; a buffer layer; an n-type layer 11, an active layer 12, and a p-type layer 13 that are composed of a Group III nitride semiconductor; a transparent electrode 14 composed of ITO; and a p-pad electrode 15. The light-emitting device further includes an n-electrode 16 formed on a square portion of the n-type layer 11, the square portion being exposed by etching a corresponding portion of the active layer 12 and the p-type layer 13. A region 17 of the transparent electrode 14 immediately below the p-pad electrode 15 have a contact resistance to the p-type layer 13 higher than the contact resistance to the p-type layer 13 of the other region of the transparent electrode 14. The light-emitting device further includes a protective film 18 composed of $SiO_2$ for the purpose of suppressing current leakage and a short circuit. The protective film 18 covers the top surface of the structure of the light-emitting device except for a region of the top surface of the p-pad electrode 15 and a region of the top surface of the n-electrode 16.

Other than a sapphire substrate, the growth substrate 10 may be a substrate composed of a material such as SiC other than Group III nitride, or a semiconductor substrate composed of a Group III nitride such as GaN.

The n-type layer 11, the active layer 12, and the p-type layer 13 may have various known structures. Specifically, the n-type layer 11 and the p-type layer 13 may be monolayers or multilayers, or may include superlattice layers. For example, the n-type layer 11 may be constituted by an n-type contact layer of $n^+$-GaN and an n-type clad layer including a superlattice structure of AlGaN/n-GaN; and the p-type layer 13 may be constituted by a p-type clad layer including a superlattice structure including a stack of a plurality of p-InGaN/p-AlGaN and a p-type contact layer of p-GaN. The active layer 12 may have a multiple quantum well (MQW) structure including a stack of a plurality of InGaN/GaN, a single quantum well (SQW) structure, or the like.

The transparent electrode 14 is formed over almost the entirety of the p-type layer 13 except for the edges of the p-type layer 13. The transparent electrode 14 permits current to diffuse in a planar direction of the light-emitting device without hindering light emission.

Both the p-pad electrode 15 and the n-electrode 16 are composed of Ni/Au/Al in which the Ni layer has a thickness of 50 nm, the Au layer has a thickness of 1500 nm, and the Al layer has a thickness of 10 nm. The Al layer is formed to enhance the degree of adhesion of the p-pad electrode 15 and the n-electrode 16 to the protective film 18. However, the Al layer is not necessarily formed and another metal layer may be formed on the Au layer.

The high resistance region 17 of the transparent electrode 14 is immediately below the p-pad electrode 15. As a result of a heat treatment, the high resistance region 17 has a composition different from that of the other region of the transparent electrode 14. Thus, the high resistance region 17 have a contact resistance to the p-type layer 13 higher than the contact resistance of the other region of the transparent electrode 14. With the presence of the region 17, current does not flow to the region 17 immediately below the p-pad electrode 15 but flows and diffuses in a planar direction from the circumference of the p-pad electrode 15 to the transparent electrode 14. As a result, a region 12a of the active layer 12 right below the p-pad electrode 15 does not emit light and hence the current density of the other region of the active layer 12 is increased and a decrease in the light-emitting efficiency caused by the presence of the p-pad electrode 15 is also prevented. Thus, the light-emitting efficiency of the light-emitting device is increased.

Figure 2:
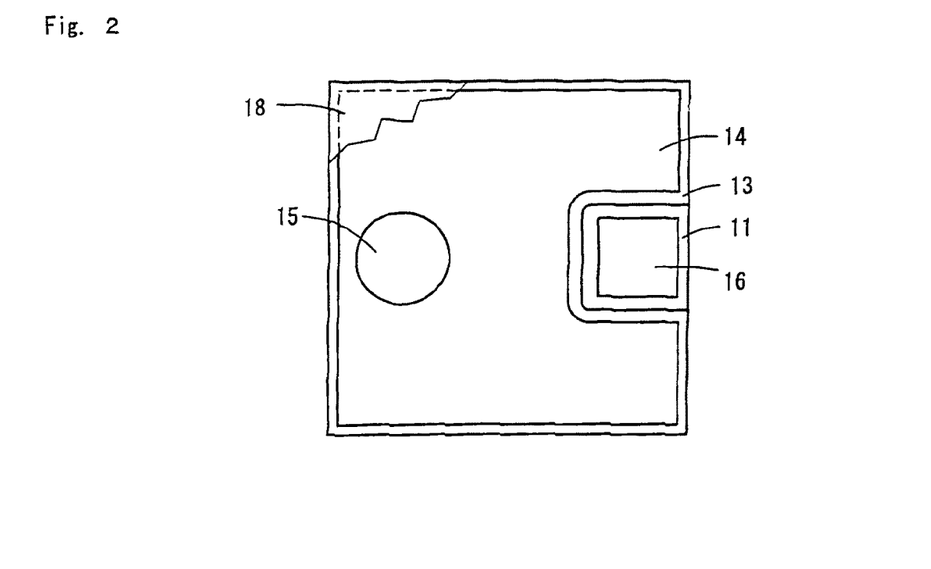
FIG. 2 is a plan view of the configuration of the Group III nitride semiconductor light-emitting device according to the first embodiment.

FIG. 2 is a plan view of the Group III nitride semiconductor light-emitting device, viewed from the top surface side of the growth substrate 10. The Group III nitride semiconductor light-emitting device has the shape of a square in plan. The p-pad electrode 15 and the n-electrode 16 are formed on the same surface side of the Group III nitride semiconductor light-emitting device. The p-pad electrode 15 has the shape of a circle in plan. The n-electrode 16 has the shape of a square in plan.

Figure 3:
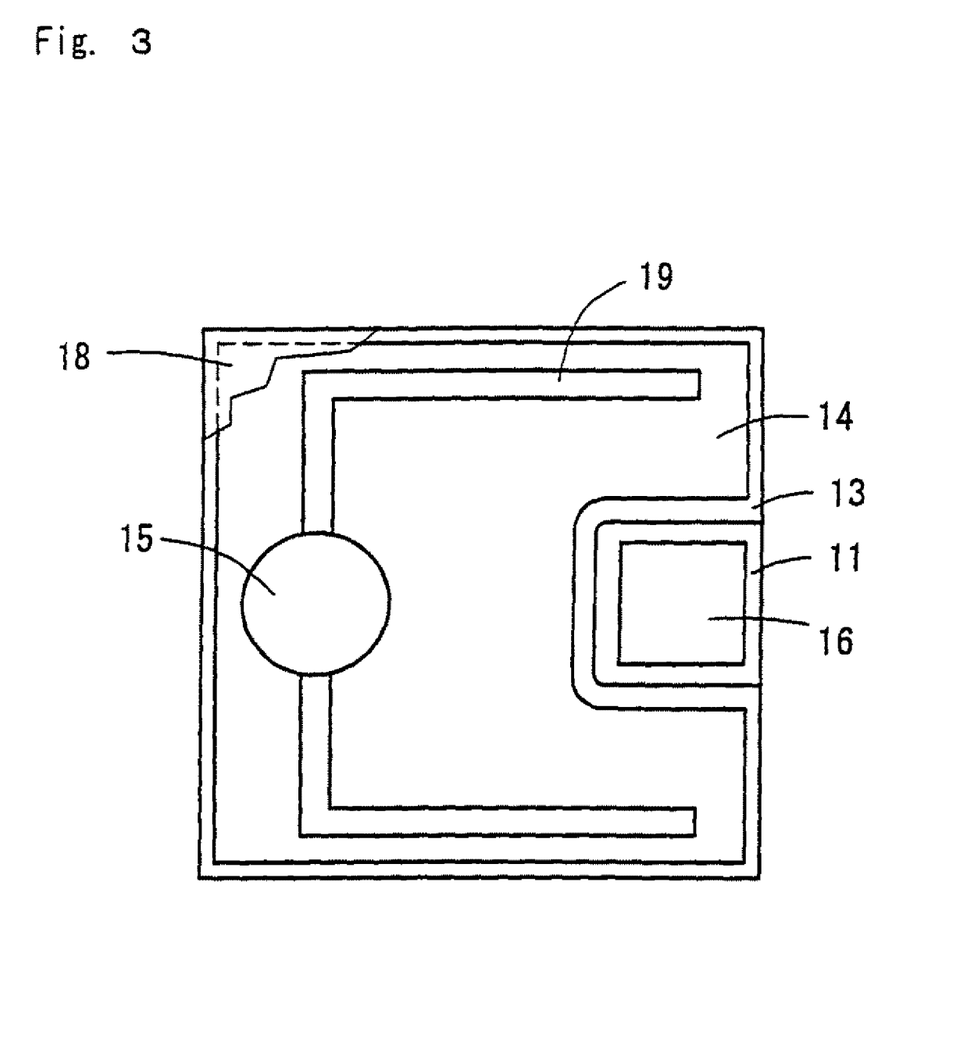
FIG. 3 is a plan view showing a modification where an extension electrode is provided for a p-pad electrode.

However, the shapes of the p-pad electrode 15 and the n-electrode 16 in plan are not restricted to these. To enhance current diffusion in a planar direction, wiring having an L-shape, U-shape, comb-shape, or the like serving as an extension electrode may be extended from the p-pad electrode 15 and/or the n-electrode 16. For example, FIG. 3 is a modification where a U-shaped extension electrode 19 is provided for the p-pad electrode 15. Such an extension electrode may be composed of Ni/Au/Al as with the p-pad electrode 15 and the n-electrode 16. Alternatively, an extension electrode may be composed of a material different from a material of the p-pad electrode 15 and the n-electrode 16. When an extension electrode composed of Ni/Au/Al is provided on the transparent electrode 14, the high resistance region 17 can be further formed in the regions of the transparent electrode 14 immediately below the extension electrode.

Hereinafter, a method for producing a Group III nitride semiconductor light-emitting device is described with reference to FIG. 4.

Figure 4A:
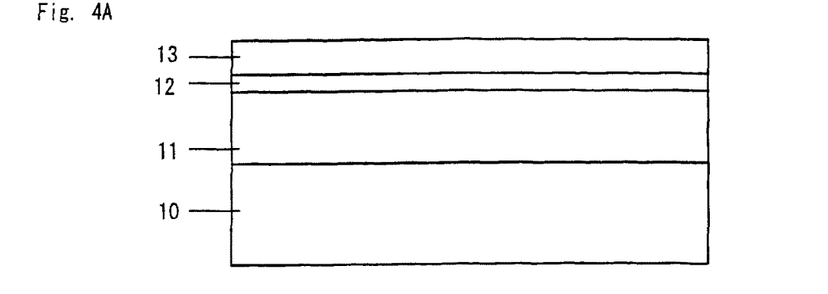
FIGS. 4A to 4D show the steps for producing the Group III nitride semiconductor light-emitting device according to the first embodiment.

The buffer layer, the n-type layer 11, the active layer 12, and the p-type layer 13 are formed in ascending order on the growth substrate 10 by a metal-organic chemical vapor deposition (MOCVD) method (FIG. 4A). In this case, the following source gases are used: TMG (trimethylgallium) as a Ga source, TMA (trimethylaluminum) as an Al source, TMI (trimethylindium) as an In source, ammonia as a N source, silane as a Si source serving as an n-type dopant, and $Cp_2Mg$ (bis-cyclopentadienyl magnesium) as a Mg source serving as a p-type dopant.

Figure 4B:
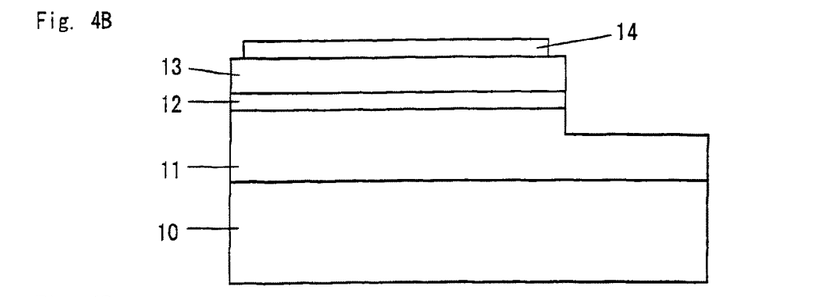

The transparent electrode 14 is subsequently formed on the p-type layer 13 by vapor deposition. Then, a mask is formed on the transparent electrode 14 and the p-type layer 13 except for a region where the n-electrode 16 will be formed. The p-type layer 13 and the active layer 12 are subjected to dry etching until the n-type layer 11 is exposed in the region. Then, the mask is stripped off (FIG. 4B). Alternatively, the transparent electrode 14 may be formed after the n-type layer 11 is exposed by the dry etching.

Figure 4C:
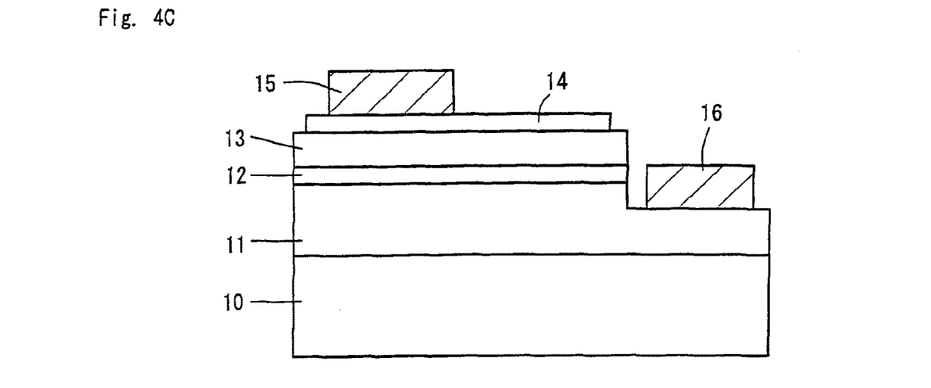

Then, the p-pad electrode 15 and the n-electrode 16 are simultaneously formed by a liftoff process (FIG. 4C). The p-pad electrode 15 composed of Ni/Au/Al is formed on a certain region of the transparent electrode 14. The n-electrode 16 also composed of Ni/Au/Al is formed on a certain region of the n-type layer 11. Thus, a good contact can be established between the p-pad electrode 15 and the transparent electrode 14.

Figure 4D:
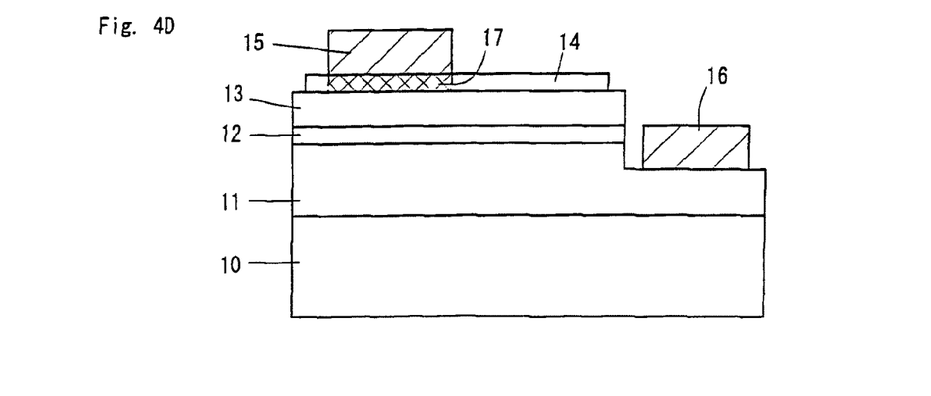

The resultant structure is subsequently heat treated in an oxygen atmosphere under a reduced pressure at 570° C. for 5 minutes. As a result, the high resistance region 17 of the transparent electrode 14 immediately below the p-pad electrode 15 is formed; the resistance of the other region of the transparent electrode 14 is decreased; and the p-pad electrode 15 and the n-electrode 16 are alloyed to have reduced contact resistances (FIG. 4D).

The temperature of the heat treatment is not restricted to 570° C. The heat treatment should be conducted in a temperature range of 500° C. to 650° C. When the heat treatment temperature is less than 500° C., the high resistance region 17 is not formed, which is not preferable. When the heat treatment temperature is more than 650° C., Ni in the p-pad electrode 15 and the n-electrode 16 is diffused to decrease the respective degrees of adhesion of the p-pad electrode 15 and the n-electrode 16 to the transparent electrode 14 and the n-type layer 11. As a result, the p-pad electrode 15 and the n-electrode 16 can be respectively separated from the transparent electrode 14 and the n-type layer 11, which is not preferable. More preferably, the heat treatment is conducted in a temperature range of 550° C. to 600° C. In a light-emitting device produced by the heat treatment conducted in a temperature range of 500° C. to 550° C., a small current flows to the region immediately below the p-pad electrode 15 and hence the region 12a of the active layer 12 right below the p-pad electrode 15 emits some amount of light. In contrast, in a light-emitting device produced by the heat treatment conducted in a temperature region of 550° C. or more, the contact resistance of the region 17 is further increased and hence the region 12a can be made not to emit light.

The heat treatment is preferably conducted for 1 to 60 minutes. When the heat treatment is conducted for less than a minute, there may be a case where the high resistance region 17 is not formed and the effects of the heat treatment are not provided with stability, which are not preferable. The heat treatment for more than 60 minutes is not suitable for mass production. Additionally, the heat treatment for more than 60 minutes is not preferable because disadvantages can be caused such as separation of the p-pad electrode 15 and the n-electrode 16, as with the heat treatment at more than 650° C.

The heat treatment is not necessarily conducted in an oxygen atmosphere and may be conducted in an atmosphere containing no oxygen.

After the heat treatment, the protective film 18 is formed over the resultant structure except for a region of the p-pad electrode 15 and a region of the n-electrode 16. Thus, the Group III nitride semiconductor light-emitting device shown in FIG. 1 is produced.

In the production method of the first embodiment, the p-pad electrode 15 and the n-electrode 16 are simultaneously formed and hence the production steps of the method are simplified. The p-pad electrode 15 and the n-electrode 16 are composed of Ni/Au/Al and hence, as a result of the heat treatment, a good contact can be established between the p-pad electrode 15 and the transparent electrode 14 composed of ITO and between the n-electrode 16 and the n-type layer 11. The region 17 can be formed by the heat treatment for alloying the p-pad electrode 15 and the n-electrode 16. As a result, the region 12a of the active layer 12 below the p-pad electrode 15 can be made not to emit light to increase the light-emitting efficiency of the light-emitting device without any extra production step.

Figure 5A:
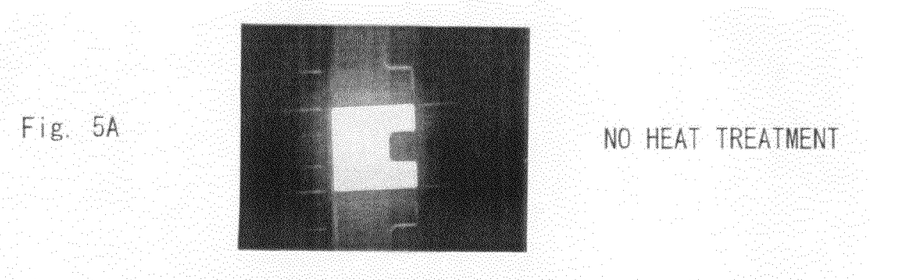
FIGS. 5A to 5D are photographs of light-emitting patterns of the Group III nitride semiconductor light-emitting devices according to the first embodiment.
Figure 5B:
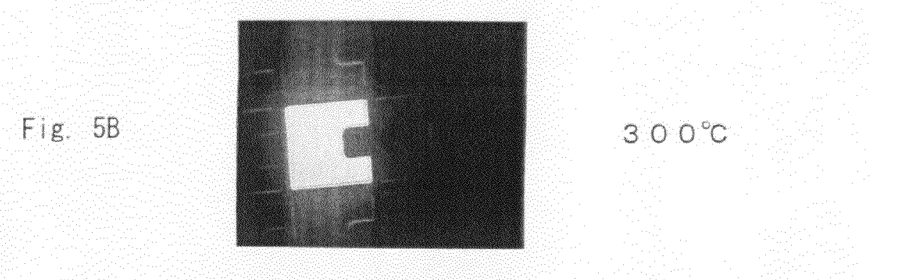
Figure 5C:
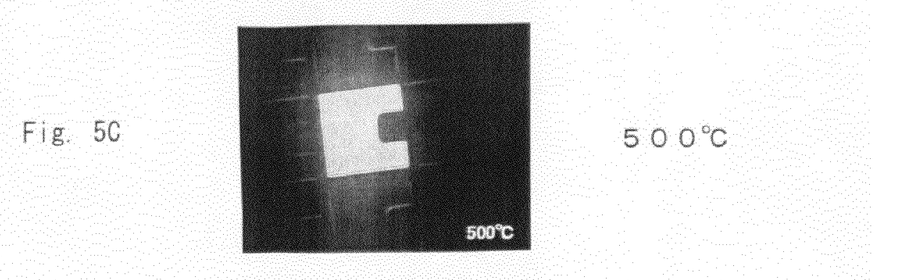
Figure 5D:
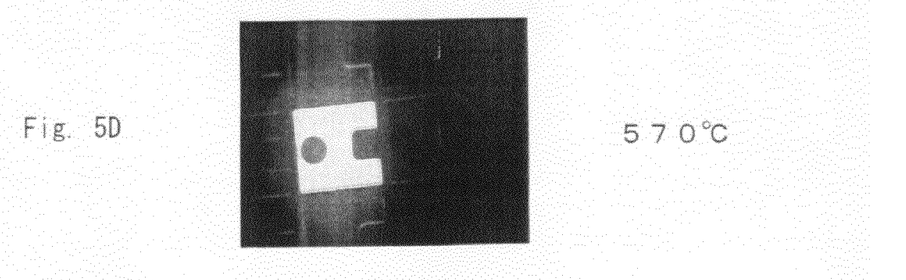

FIGS. 5A to 5D show photographs of light-emitting patterns of Group III nitride semiconductor light-emitting devices operated at 20 mA. These light-emitting devices were produced by the heat treatments conducted at different temperatures after the formation of the p-pad electrode 15 and the n-electrode 16. The photographs were taken from the back surface side of the growth substrate 10, that is, the surface side opposite the side shown in FIG. 2. FIG. 5A corresponds to a case where no heat treatment was conducted. FIG. 5B corresponds to a case where the heat treatment at 300° C. was conducted. FIG. 5C corresponds to a case where the heat treatment at 500° C. was conducted. FIG. 5D corresponds to a case where the heat treatment at 570° C. was conducted. In FIGS. 5A and 5B, almost the entire surfaces except for the region etched for forming the n-electrode 16 emitted light. In contrast, in FIG. 5C, the region where the p-pad electrode 15 was formed emitted weaker light. In FIG. 5D, the region where the p-pad electrode 15 was formed substantially emitted no light.

The p-pad electrode 15 composed of Ni/Au is formed on the transparent electrode 14 composed of ITO and the resultant structure is subjected to the heat treatment, thereby forming the high resistance region 17 immediately below the p-pad electrode 15, the region 17 having a higher contact resistance than the contact resistance of the other region of the transparent electrode 14. This is presumably because Ni tends to capture oxygen and is susceptible to oxidation. Ni captures oxygen from the transparent electrode 14 immediately below the p-pad electrode 15 during the heat treatment, thereby forming the region 17 having a composition different from that of the original transparent electrode 14. Because of the composition different from that of the transparent electrode 14, the region 17 has a higher contact resistance than the contact resistance of the other region of the transparent electrode 14. The heat treatment also causes oxidation of Ni to generate nickel oxide at the interface between the transparent electrode 14 and the p-pad electrode 15. This is presumably another cause that the region 17 has an increased contact resistance.

Thus, the high resistance region 17 having a higher contact resistance immediately below the p-pad electrode 15 can be presumably formed, as in the case where the p-pad electrode 15 is composed of Ni/Au, by forming the p-pad electrode 15 with a material containing a metal element susceptible to oxidation.

Second Embodiment

Figure 6:
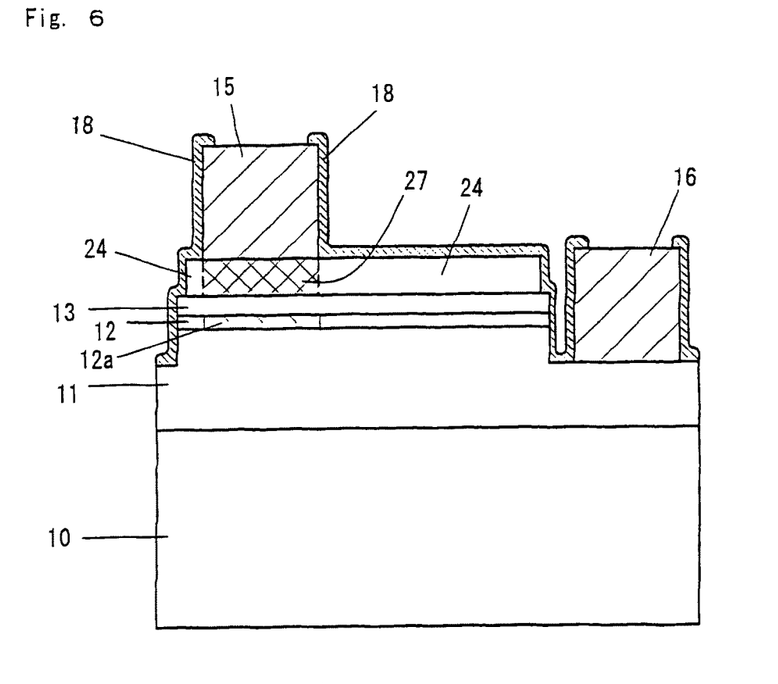
FIG. 6 is a section view showing the configuration of a Group III nitride semiconductor light-emitting device according to a second embodiment.

FIG. 6 is a section view showing the configuration of a Group III nitride semiconductor light-emitting device with a face-up configuration according to a second embodiment. This Group III nitride semiconductor light-emitting device includes, in ascending order, a growth substrate 10 composed of sapphire; a buffer layer; an n-type layer 11; an active layer 12 and a p-type layer 13 that are composed of a Group III nitride semiconductor; a transparent electrode 24 composed of ICO (indium oxide doped with cerium); and a p-pad electrode 15. The light-emitting device further includes an n-electrode 16 formed on a square portion of the n-type layer 11, the square portion being exposed by etching a corresponding portion of the p-type layer 13. Like elements in the light-emitting device of the second embodiment are denoted with like reference numerals in the Group III nitride semiconductor light-emitting device of the first embodiment. A high resistance region 27 of the transparent electrode 24 immediately below the p-pad electrode 15 have a contact resistance to the p-type layer 13 higher than the contact resistance to the p-type layer 13 of the other region of the transparent electrode 24.

Figure 7:
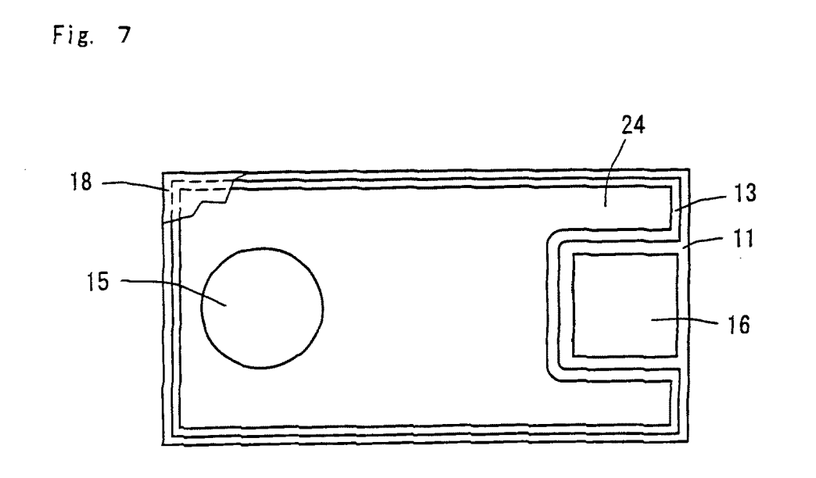
FIG. 7 is a plan view of the configuration of the Group III nitride semiconductor light-emitting device according to the second embodiment.

FIG. 7 is a plan view of the Group III nitride semiconductor light-emitting device of the second embodiment, viewed from the top surface side of the growth substrate 10. The p-pad electrode 15 and the n-electrode 16 are formed on the same surface side of the Group III nitride semiconductor light-emitting device. The Group III nitride semiconductor light-emitting device has the shape of a rectangle in plan, the rectangle being lengthwise in the direction through the p-pad electrode 15 and the n-electrode 16.

The high resistance region 27 is formed in the same manner as in the formation of the high resistance region 17 of the Group III nitride semiconductor light-emitting device of the first embodiment. The region 27 of the transparent electrode 24 is immediately below the p-pad electrode 15. As a result of a heat treatment, the region 27 has a composition different from that of the other region of the transparent electrode 24. Thus, the region 27 have a contact resistance to the p-type layer 13 higher than the contact resistance of the other region of the transparent electrode 24. Thus, a region 12*a* in the active layer 12 below the region 27 does not emit light, thereby increasing the light-emitting efficiency of the light-emitting device.

The Group III nitride semiconductor light-emitting device of the second embodiment can be produced by production steps similar to the steps for producing the Group III nitride semiconductor light-emitting device of the first embodiment. The light-emitting device of the second embodiment can provide advantages similar to those of the light-emitting device of the first embodiment. Specifically, in the production steps of the second embodiment, the p-pad electrode 15 and the n-electrode 16 can be simultaneously formed. This is because the p-pad electrode 15 and the n-electrode 16 are composed of Ni/Au/Al and hence, as a result of a heat treatment, a good contact can be established between the p-pad electrode 15 and the transparent electrode 24 composed of ICO and between the n-electrode 16 and the n-type layer 11. The high resistance region 27 can be formed by this heat treatment. As a result, the light-emitting efficiency of the light-emitting device can be increased without any extra production step.

Figure 8:
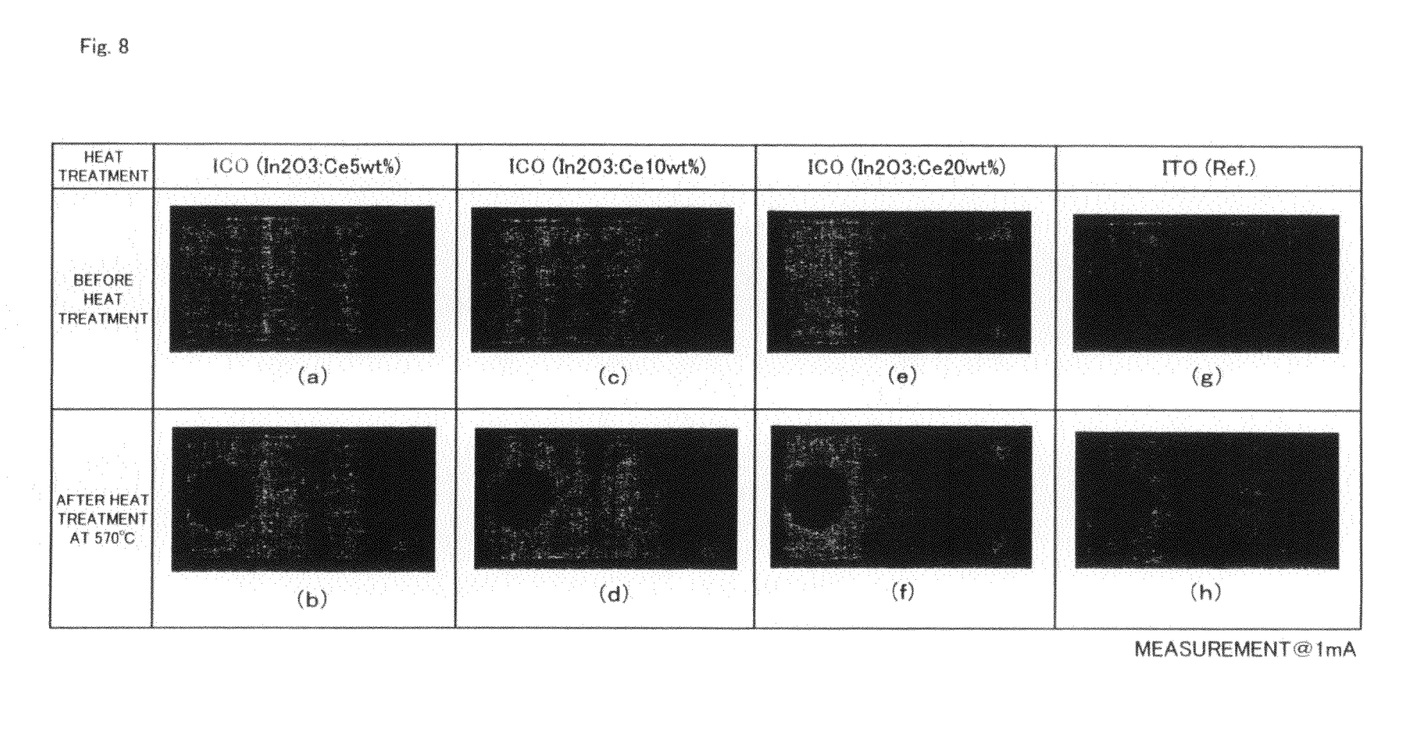
FIG. 8 shows photographs of light-emitting patterns of the Group III nitride semiconductor light-emitting devices according to the second embodiment.

FIG. 8 shows photographs of light-emitting patterns of Group III nitride semiconductor light-emitting devices operated at 1 mA. The photographs were taken before and after the heat treatments conducted after the formation of the p-pad electrode 15 and the n-electrode 16. The photographs were taken from the back surface side of the growth substrate 10, that is, the surface side opposite the side shown in FIG. 7. FIGS. 8(*a*) and 8(*b*) correspond to cases where the content of cerium in the transparent electrode 24 was 5 wt %. FIG. 8(*a*) is a photograph taken before the heat treatment and FIG. 8(*b*) is a photograph taken after the heat treatment. FIGS. 8(*c*) and 8(*d*) correspond to cases where the content of cerium in the transparent electrode 24 was 10 wt %. FIG. 8(*c*) is a photograph taken before the heat treatment and FIG. 8(*d*) is a photograph taken after the heat treatment. FIGS. 8(*e*) and 8(*f*) correspond to cases where the content of cerium in the transparent electrode 24 was 20 wt %. FIG. 8(*e*) is a photograph taken before the heat treatment and FIG. 8(*f*) is a photograph taken after the heat treatment. For comparison, light-emitting patterns of a Group III nitride semiconductor light-emitting device having the same configuration except for including a transparent electrode composed of ITO instead of the transparent electrode 24 composed of ICO are also shown. FIG. 8(*g*) is a photograph taken before the heat treatment and FIG. 8(*h*) is a photograph taken after the heat treatment.

As shown in FIG. 8, almost the entire surfaces except for the region where the n-electrode 16 was formed emitted light before the heat treatment, whereas the region where the p-pad electrode 15 was formed substantially emitted no light after the heat treatment. Variation in the content of cerium did not result in considerable variation in the light-emitting patterns after the heat treatment. The light-emitting patterns after the heat treatment in the cases where ICO was used were not considerably different from the light-emitting pattern after the heat treatment in the case where ITO was used. Thus, when a transparent electrode is formed with an indium oxide-based material, a light-emitting pattern similar to that in the case of using ITO is presumably obtained after a heat treatment. The regions 17 and 27 having a high contact resistance are formed presumably because oxygen reacts with a material of the p-pad electrode 15 to change the composition of the transparent electrode as described above. For this reason, when an oxide having a sufficiently high transparency and conductivity is used as a material for a transparent electrode, a light-emitting pattern in which a region corresponding to the p-pad electrode 15 does not emit light is presumably obtained.

In the first and second embodiments, the p-pad electrode and the n-electrode are simultaneously formed. Alternatively, in the case where the p-pad electrode and the n-electrode are formed with different materials and are not simultaneously formed, a region of a transparent electrode immediately below the p-pad electrode can be made to have an increased contact resistance, as in the embodiments, by using Ni/Au for forming the p-pad electrode and conducting a heat treatment at 500° C. to 650° C. When the n-electrode is formed with a material other than Ni/Au, for example, V/Al may be used.

In the first and second embodiments, the p-pad electrode 15 is formed with Ni/Au. Alternatively, when the p-pad electrode is formed with a material containing Ti such as Ti/Au, a region of a transparent electrode immediately below the p-pad electrode can be made to have a higher contact resistance than that of the other region of the transparent electrode by conducting a heat treatment. Note that a good contact between Ti/Au and the n-type layer 11 is not provided even when Ti/Au is subjected to a heat treatment. For this reason, an n-electrode should be formed with a material other than Ti/Au, and the p-pad electrode 15 and the n-electrode should be separately formed.

Group III nitride semiconductor light-emitting devices according to the present invention can be used as light sources of display apparatuses and illuminating apparatuses.

What is claimed is:

1. A method for producing a Group III nitride semiconductor light-emitting device with a face-up configuration, the light-emitting device including a p-type layer, a transparent electrode comprising an oxide and formed on the p-type layer, a p-pad electrode comprising Ni/Au and formed on the transparent electrode and on a surface side of the light-emitting device, and an n-electrode comprising Ni/Au and formed on the surface side of the light-emitting device, the method comprising:
    simultaneously forming the p-pad electrode and the n-electrode; and
    forming a high resistance region in the transparent electrode immediately below the p-pad electrode by a heat treatment at 500° C. to 650° C. in an oxygen atmosphere under a reduced pressure after said forming the p-pad electrode and the n-electrode,
    wherein the high resistance region has a contact resistance to the p-type layer higher than a contact resistance to the p-type layer of a region other than the high resistance region in the transparent electrode such that light is not emitted in a region of an active layer below the p-pad electrode, and the transparent electrode comprises an indium oxide-based material.

2. The method according to claim 1, wherein the transparent electrode comprises any one selected from a group consisting of ITO and ICO.

3. A Group III nitride semiconductor light-emitting device having a face-up configuration, the light-emitting device including:
   a p-type layer;
   a transparent electrode comprising an oxide and formed on the p-type layer;
   a p-pad electrode comprising Ni/Au and formed on the transparent electrode and on a surface side of the light-emitting device; and
   an n-electrode on the surface side of the light-emitting device,
   wherein the transparent electrode includes a high resistance region immediately below the p-pad electrode, and
   wherein the high resistance region has a contact resistance to the p-type layer higher than a contact resistance to the p-type layer of a region other than the high resistance region in the transparent electrode such that light is not emitted in a region of an active layer below the p-pad electrode, and the transparent electrode comprises an indium oxide-based material.

4. The Group III nitride semiconductor light-emitting device according to claim 3, wherein the n-electrode comprises Ni/Au.

5. The Group III nitride semiconductor light-emitting device according to claim 3, wherein the transparent electrode comprises any one selected from a group consisting of ITO and ICO.

6. The Group III nitride semiconductor light-emitting device according to claim 3, wherein at least one of the p-pad electrode and the n-electrode includes a wiring serving as an extension electrode.

7. The Group III nitride semiconductor light-emitting device according to claim 4, wherein at least one of the p-pad electrode and the n-electrode includes a wiring serving as an extension electrode.

8. The method according to claim 1, wherein the p-pad electrode and the n-electrode comprise a layer of Al disposed on Au.

9. The Group III nitride semiconductor light-emitting device according to claim 3, wherein the p-pad electrode and the n-electrode comprise a layer of Al disposed on Au.

10. The Group III nitride semiconductor light-emitting device according to claim 6, wherein the extension electrode is formed on a surface of the light emitting device.

11. The method according to claim 1, wherein the high resistance region abuts the p-pad electrode.

12. The method according to claim 1, wherein said heat treatment comprises combining Ni in the Ni/Au with oxygen of an oxide of the transparent electrode to form the high resistance region inside the transparent electrode.

13. The Group III nitride semiconductor light-emitting device according to claim 3, wherein the high resistance region abuts the p-pad electrode and is disposed above an upper surface of the p-type layer.

14. The method according to claim 1, wherein the high resistance region prevents a current from flowing to the high resistance region immediately below the p-pad electrode such that the current flows and diffuses in a planar direction from a circumference of the p-pad electrode to the transparent electrode.

15. The method according to claim 1, wherein the high resistance region is disposed on an upper surface of the p-type layer and the region of the active layer is disposed on a bottom surface of the p-type layer.

16. The Group III nitride semiconductor light-emitting device according to claim 3, wherein the high resistance region is disposed on an upper surface of the p-type layer and the region of the active layer is disposed on a bottom surface of the p-type layer.

17. The Group III nitride semiconductor light-emitting device according to claim 3, wherein the high resistance region prevents a current from flowing to the high resistance region immediately below the p-pad electrode such that the current flows and diffuses in a planar direction from a circumference of the p-pad electrode to the transparent electrode.

* * * * *